United States Patent
Yang et al.

(10) Patent No.: US 8,178,414 B2
(45) Date of Patent: May 15, 2012

(54) NMOS ARCHITECTURE INVOLVING EPITAXIALLY-GROWN IN-SITU N-TYPE-DOPED EMBEDDED ESIGE:C SOURCE/DRAIN TARGETING

(75) Inventors: Bin Yang, Mahwah, NJ (US); Bo Bai, Fishkill, NY (US)

(73) Assignee: Globalfoundries Inc., Grand Cayman (KY)

( * ) Notice: Subject to any disclaimer, the term of this patent is extended or adjusted under 35 U.S.C. 154(b) by 294 days.

(21) Appl. No.: 12/632,351

(22) Filed: Dec. 7, 2009

(65) Prior Publication Data

US 2011/0133189 A1    Jun. 9, 2011

(51) Int. Cl.
*H01L 21/02*      (2006.01)
(52) U.S. Cl. ........ 438/300; 438/302; 438/305; 438/486; 438/664; 257/E21.131; 257/E21.409; 257/E21.431; 257/E21.619; 257/E29.255
(58) Field of Classification Search .......... 438/283–306, 438/486, 663–664; 257/E21.131, 409, 431, 257/619, 632, 29.255
See application file for complete search history.

(56) References Cited

U.S. PATENT DOCUMENTS

| | | | | |
|---|---|---|---|---|
| 7,625,801 B2 * | 12/2009 | Wu et al. | ........................ | 438/300 |
| 7,763,505 B2 * | 7/2010 | Gehring et al. | ................ | 438/187 |
| 7,811,876 B2 * | 10/2010 | Scott et al. | ..................... | 438/199 |
| 7,906,383 B2 * | 3/2011 | Richter et al. | ................... | 438/199 |
| 7,951,657 B2 * | 5/2011 | Cheng et al. | ................... | 438/151 |
| 8,048,750 B2 * | 11/2011 | Wu et al. | ....................... | 438/293 |
| 8,062,946 B2 * | 11/2011 | Yeo et al. | ...................... | 438/285 |
| 2007/0123010 A1 * | 5/2007 | Hoentschel et al. | .......... | 438/486 |
| 2007/0281472 A1 * | 12/2007 | Press et al. | ..................... | 438/664 |
| 2008/0299724 A1 * | 12/2008 | Grudowski et al. | ........... | 438/257 |
| 2009/0302348 A1 * | 12/2009 | Adam et al. | ................... | 257/190 |

* cited by examiner

*Primary Examiner* — Michael Lebentritt
(74) *Attorney, Agent, or Firm* — Ditthavong Mori & Steiner, P.C.

(57) ABSTRACT

An NMOS transistor is formed with improved manufacturability. An embodiment includes forming N-type doped embedded silicon germanium containing carbon (eSiGe:C) in source/drain regions of a substrate, and amorphizing the eSiGe:C. The use of eSiGe:C provides a reduction in extension silicon and dopant loss, improved morphology, increased wafer throughput, improved short channel control, and reduced silicide to source/drain contact resistance.

12 Claims, 4 Drawing Sheets

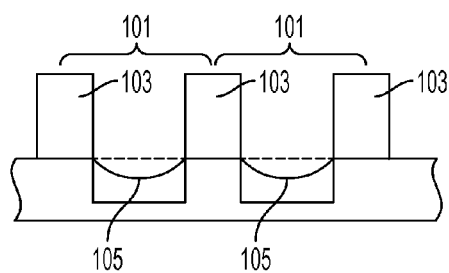
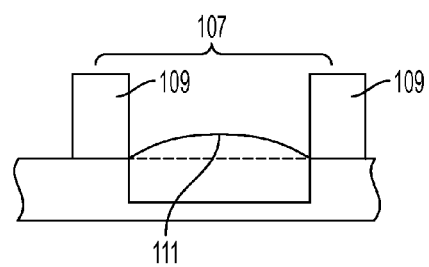
FIG. 1A　　　　　　　FIG. 1B
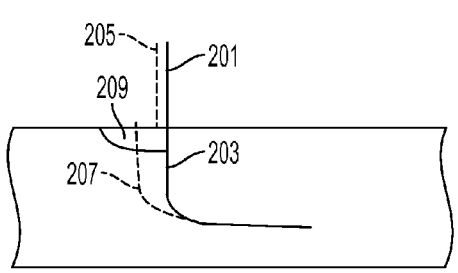
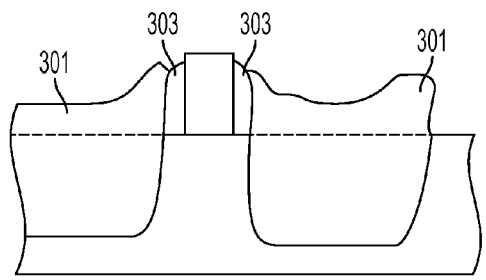
FIG. 2　　　　　　　FIG. 3

US 8,178,414 B2

NMOS ARCHITECTURE INVOLVING EPITAXIALLY-GROWN IN-SITU N-TYPE-DOPED EMBEDDED ESIGE:C SOURCE/DRAIN TARGETING

TECHNICAL FIELD

The present disclosure relates to semiconductor devices with N-type in situ doped transistors. The present disclosure is particularly applicable to semiconductors for 22 nanometer (nm) node devices and beyond.

BACKGROUND

Due to pitch scaling in each generation, the spacers that define deep source/drain implants have been significantly reduced in thickness. For example, for a 22 nm node CMOS transistor the spacer thickness is less than or equal to 20 nm, whereas for 32 nm node and 45 nm node technologies, the spacer thickness is about 35 nm and about 45 nm, respectively. A small spacer thickness such as less than 20 nm makes the conventional deep source/drain implants no longer viable. This is because the lateral-implant-straggle inherent to the implant process overruns the extension for short channel devices, causing significant short channel degradation. Therefore, an in-situ doped source/drain process has attracted interest for 22 nm node and beyond CMOS transistor.

An in-situ phosphorus-doped (ISPD) embedded Si:C (eSi:C) source/drain process appears suitable for 22 nm node NMOS transistor to avoid source/drain overrunning the extension, since ISPD eSi:C offers not only doped source/drains, but also tensile channel stress. However, it was found that ISPD eSi:C has several disadvantages. For example, the ISPD eSi:C epitaxial process throughput is unacceptably low, as fewer than two wafers can be processed per hour, whereas at least four wafers per hour is considered to be an acceptable throughput. In addition, the eSi:C fill level is extremely sensitive to device pitch, and multiple pitches may be present on the same wafer. As illustrated in FIGS. 1A and 1B, respectively, for a single pitch 101 (100 nm) between gates 103, the source/drain is under-filled (fill height 105) and for a double pitch 107 (200 nm) between gates 109, the source/drain is overfilled (fill height 111). The epitaxial fill height difference causes significant variation in device parametrics, such as threshold voltage (Vt), capacitance (Cov), Ion, etc. Further, the deposition/etch-back/deposition/etch-back cyclic epitaxial process (the process during epitaxial growth wherein Si:C is periodically etched off where it is unwanted) causes extension silicon and dopant loss. Adverting to FIG. 2, spacer edge 201, with which eSi:C/Si recess boundary 203 is formed, and boundary 203 itself are eroded by the etch-back process to spacer edge 205 and boundary 207, respectively. A portion of silicon extension 209 (i.e., the portion between recess boundary 203 and boundary 207) is thus undesirably etched. This extension loss increases the resistance, is not controllable from wafer to wafer and lot to lot, and, therefore, introduces another source of variability, which is undesirable for manufacturing.

Another approach to improve the source/drain for a 22 nm node NMOS transistor is to grow N-type-doped silicon for the NMOS source/drain. Although this approach simplifies the epitaxial process, it fails to provide stress to influence channel mobility. Since the incorporation of arsenic in silicon (less than 1E20 cm-3) is low, in-situ arsenic doped silicon is not suitable as an NMOS source/drain. Although the incorporation of phosphorus in silicon (greater than 5E20 cm-3) is significantly higher than arsenic, an ISPD silicon epitaxial process for nMOS source/drains has other serious issues. For example, the ISPD silicon epitaxial throughput in NMOS transistors is relatively low, for example less than or equal to 3 wafers per hour. In addition, epitaxially deposited ISPD silicon has poor selectivity, i.e., it grows on nitride spacers, thereby causing an undesirable morphology as illustrated in FIG. 3. The ISPD silicon grows on spacers 303 and has an irregular shape. The poor morphology causes high Cov and introduces another source of device parametric variations.

A need therefore exists for methodology enabling fabrication of in-situ doped NMOS source/drains with high manufacture throughput, uniform fill level, reduced extension silicon and dopant loss, and improved morphology, and for the resulting device.

SUMMARY

An aspect of the present disclosure is a semiconductor including amorphized N-doped eSiGe:C source/drains.

Another aspect of the present disclosure is a method of fabricating a semiconductor including amorphized N-doped eSiGe:C source/drains.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming N-type doped embedded silicon germanium containing carbon (eSiGe:C) in source/drain regions of a substrate; and amorphizing the eSiGe:C.

Aspects of the present disclosure include forming an N-type eSiGe:C by epitaxially growing eSiGe:C in source/drain regions of a substrate. Further aspects include doping the epitaxially grown SiGe:C in-situ with phosphorus. Other aspects include forming the eSiGe:C with less than about 0.2 at. % carbon, such as about 0.08 at. % to about 0.15% carbon, e.g., about 0.1 at. % carbon. Additional aspects include amorphizing to relax compressive strain by implanting a dopant, for example, germanium (Ge), Xenon (Xe), or silicon (Si).

Another aspect of the present disclosure is a semiconductor device comprising: a substrate having source/drain regions; and amorphized N-type doped eSiGe:C in the source/drain regions.

Aspects include a semiconductor device wherein eSiGe:C is epitaxially grown in source/drain regions of a substrate. Further aspects include a semiconductor device wherein the epitaxially grown eSiGe:C is doped in-situ with phosphorus. Another aspect includes a semiconductor device including N-type eSiGe:C which contains less than about 0.2 at. % carbon, such as about 0.08 at. % to about 0.15% carbon, e.g., about 0.1% carbon. Additional aspects include a semiconductor device wherein the N-type eSiGe:C contains an implanted amorphizing dopant, e.g., Ge, Xe, or Si, to reduce compressive strain.

A further aspect of the present disclosure is a method of fabricating a CMOS semiconductor device comprising: forming in-situ boron-doped eSiGe in first source/drain regions on a substrate, to form a PMOS transistor; epitaxially growing in-situ phosphorus doped eSiGe:C in second source/drain regions on a substrate to form an NMOS transistor; and implanting an amorphization dopant only in the in-situ phosphorus doped eSiGe:C to neutralize compressive strain.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B schematically illustrate ISPD eSi:C single pitch underfilling and double pitch over filling, respectively;

FIG. 2 schematically illustrates extension silicon and dopant loss with ISPD eSi:C;

FIG. 3 schematically illustrates poor morphology with ISPD silicon;

DETAILED DESCRIPTION

Figure 4:
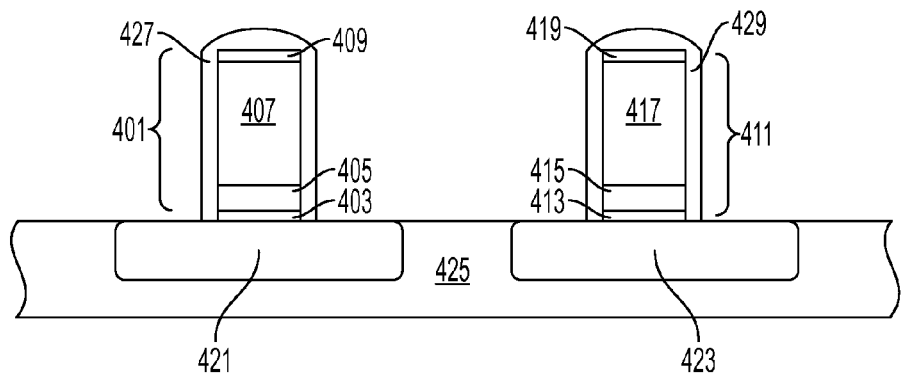
FIGS. 4 through 12 schematically illustrate sequential steps of a method in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the doping problem attendant upon forming a 20 nm node NMOS transistor. In accordance with embodiments of the present disclosure, phosphorus doping is performed in-situ, which prevents overrunning the extension and causing short channel degradation. Further, eSiGe:C is employed to avoid the need to etch back after deposition. Consequently, throughput is increased and silicon extension and dopant loss is prevented. In addition since the band gap of eSiGe:C is smaller than Si:C, the silicide to source/drain contact resistance is reduced.

Methodology in accordance with embodiments of the present disclosure includes forming N-type doped eSiGe:C in source/drain regions of a substrate, and amorphizing the eSiGe:C.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 4 through 12 schematically illustrate sequential steps of a method in accordance with an exemplary embodiment. Adverting to FIG. 4, gate stack 401, including gate dielectric 403, metal gate 405, amorphous or polycrystalline silicon 407, and nitride cap 409, and gate stack 411, including gate dielectric 413, metal gate 415, amorphous or polycrystalline silicon 417, and nitride cap 419 are formed on active silicon portions 421 and 423 in substrate 425 in a conventional manner. Offset spacers 427 and 429 are formed on each side of gate stack 401 and 411, respectively. Offset spacers 427 and 429 may be formed of an oxide or a nitride to a thickness of about 10 Å to about 100 Å, e.g., about 100 Å.

Figure 5:
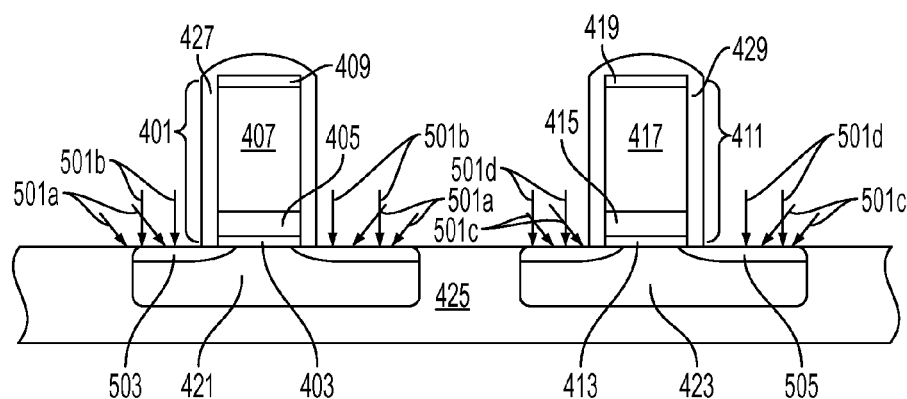

As illustrated in FIG. 5, halo implants 501a and extension implants 501b dope the top portion 503 of silicon 421 and halo implants 501c and extension implants 501d dope the top portion 505 of silicon 423 for NMOS and PMOS respectively. The NMOS halo implantation 501a may be boron difluoride ($BF_2$) at an energy of about 10 keV to about 50 keV and at a dosage of about $1e13/cm^2$ to about $5e13/cm^2$. The NMOS extension implantation 501b may be arsenic at an energy of about 1 keV to about 3 keV and at a dosage of about $1e15/cm^2$ to about $5e15/cm^2$. The PMOS halo implantation 501c may be arsenic at an energy of about 10 keV to about 50 keV and at a dosage of about $1e13/cm^2$ to about $5e13/cm^2$. The PMOS extension implantation 501d may be $BF_2$ at an energy of about 1 keV to about 3 keV and at a dosage of about $1e15/cm^2$ to about $4e15/cm^2$. The implantation is followed by a rapid thermal anneal (RTA) with the temperature in the range of about 800° C. to about 1065° C.

Figure 6:
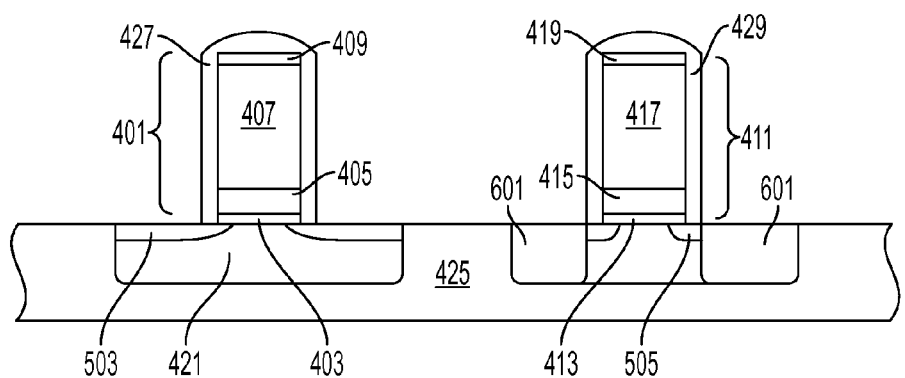

As illustrated in FIG. 6, in-situ boron doped eSiGe (B:eSiGe) is epitaxially grown in a conventional manner in recesses formed in active silicon 423 on each side of gate stack 411 to form PMOS source/drain regions 601.

Figure 7:
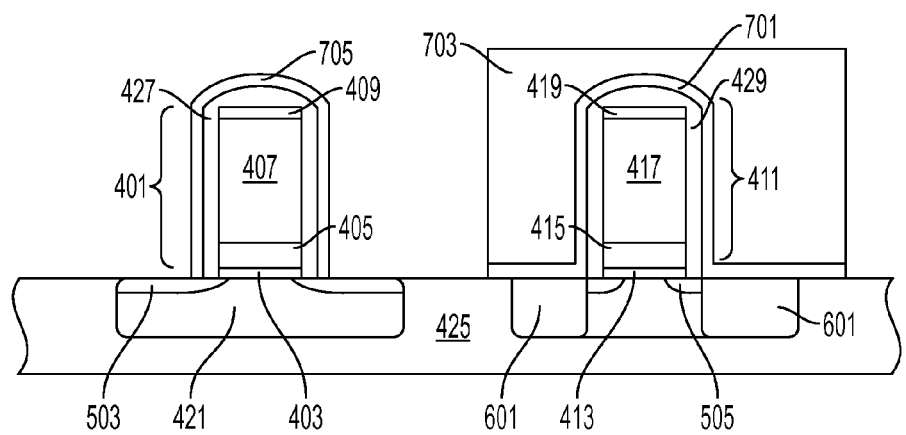

Adverting to FIG. 7, after the formation of the B:eSiGe source/drain regions 601, a silicon nitride (SiN) layer is deposited over the entire substrate. Then a photoresist material is formed over the SiN layer on the PMOS. The SiN and photoresist are lithographically etched forming SiN layer 701 and photoresist 703. The SiN layer around gate stack 401 is reactive ion etched (RIE) to form spacers 705, as shown in FIG. 7.

Figure 8:
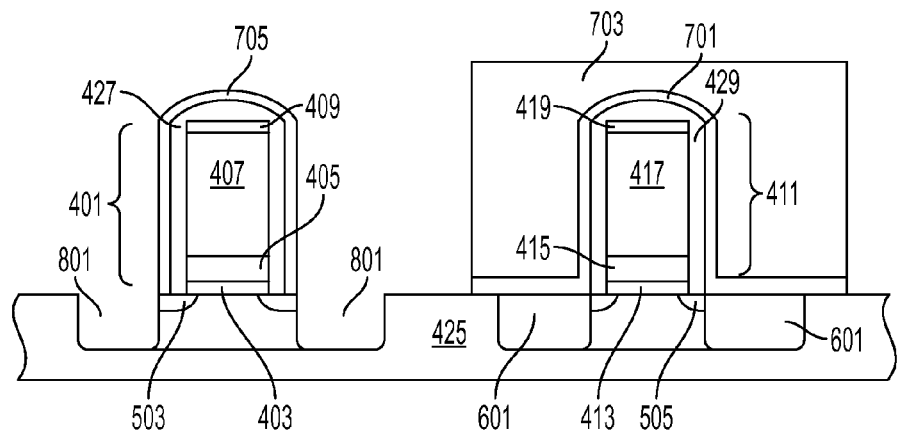
Figure 9:
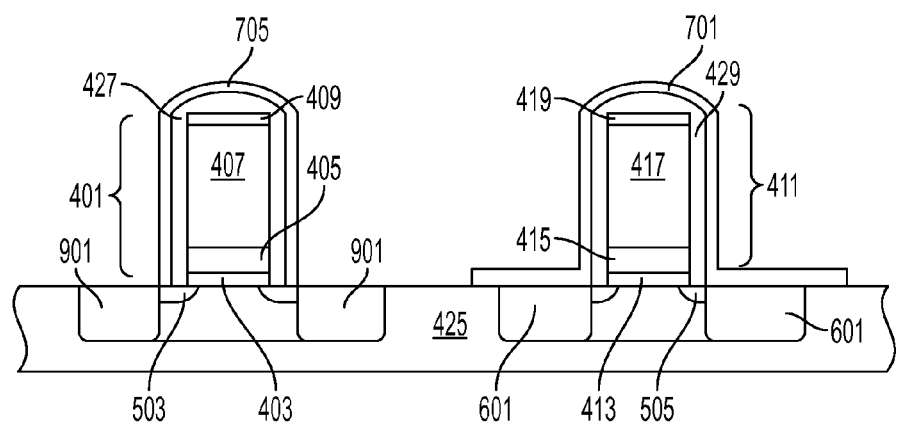

As shown in FIG. 8, recesses 801 defined by SiN spacers 705 are formed in silicon 421 by an RIE process. ISPD eSiGe:C is then epitaxially grown in recesses 801, thereby forming NMOS source/drains 901, as illustrated in FIG. 9. The carbon concentration may be less than about 0.2 at. %, such as about 0.1 at. % to about 0.2 at. %, e.g. about 0.08 at. % to about 0.15 at. %, i.e., about 0.1 at. %. The phosphorus may be introduced in-situ at a dosage of about $1e19/cm^3$ to about $6e20/cm^3$. Although the N-type dopant has been described as phosphorus, arsenic may also be employed.

Figure 10:
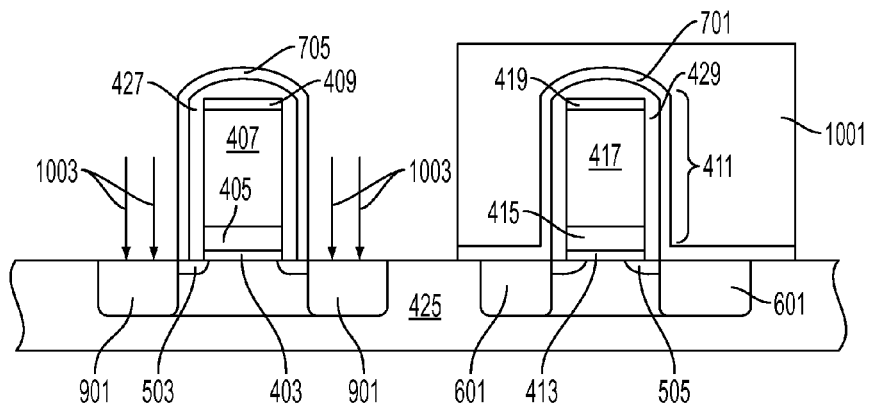

Adverting to FIG. 10, a second resist 1001 is formed over the PMOS transistor so that an amorphization implant dopant may be introduced only into the NMOS transistor. A dopant 1003, for example Ge, Xe, or Si, is implanted into the ISPD eSiGe:C to relax or neutralize the compressive strain intrinsic to eSiGe:C and to prevent channeling. The amorphization dopant may be implanted at an energy of about 10 keV to about 50 keV and at a dosage of about $1e13/cm^2$ to about $1e14/cm^2$.

Figure 11:
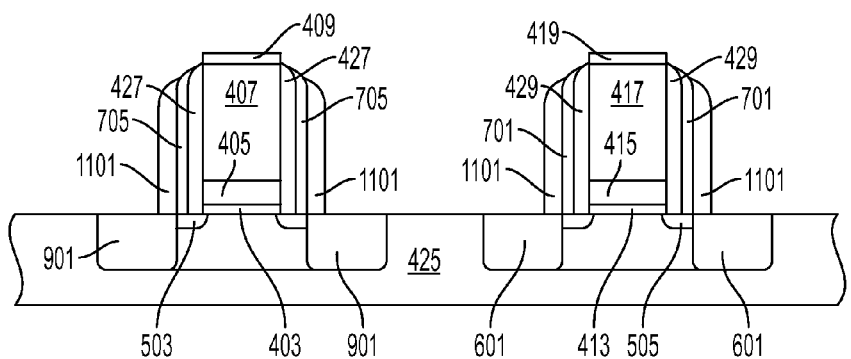

After the amorphization implant, resist 1001 is removed. Another layer of SiN is formed over the entire surface, including both the NMOS and PMOS transistors. As illustrated in FIG. 11, the SiN layer is then etched to form SiN spacers 1101. A laser anneal follows the formation of spacers 1101.

Figure 12:
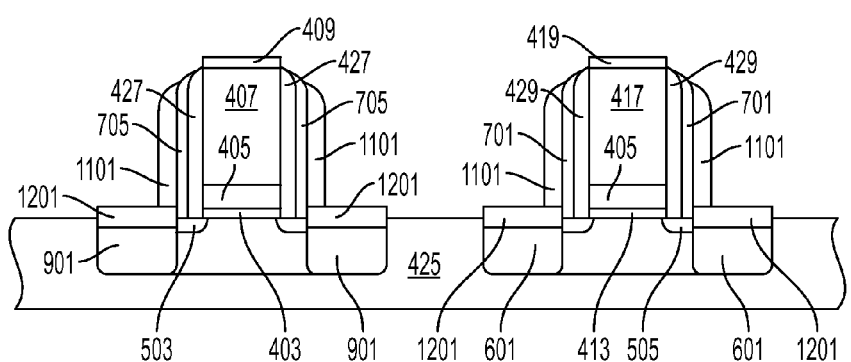

Adverting to FIG. 12, silicide 1201 is formed for both the NMOS and PMOS transistors. Silicide 1201 may be formed in a conventional manner, for example of nickel platinum with about 5 to 10% nickel or of cobalt. Then conventional middle-of-line (MOL) and back-end-of-line (BEOL) processes, such as formation of contacts down to silicide 1201, proceed to complete the CMOS fabrication.

The embodiments of the present disclosure can achieve several technical effects, including epitaxial process stability and repeatability with the mature epitaxial tooling (since the process for epitaxially growing eSiGe:C for NMOS transistors is the same and uses the same tools as have been used for epitaxially growing eSiGe:C for PMOS transistors), minimal loading effect with different device pitch, improved epitaxial morphology, acceptable wafer throughput, improved source/drain to channel junction for better short channel control, and lower silicide to eSiGe:C contact resistance. The present disclosure enjoys industrial applicability in any of various types of highly integrated semiconductor devices including NMOS transistors.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming N-type doped embedded silicon germanium containing carbon (eSiGe:C) in source/drain regions of a substrate; and
    amorphizing the eSiGe:C.

2. The method according to claim 1, comprising forming the N-type eSiGe:C by epitaxially growing eSiGe:C in the source/drain regions.

3. The method according to claim 2, comprising doping the epitaxially grown SiGe:C in-situ with phosphorus.

4. The method according to claim 3, comprising forming the eSiGe:C with less than about 0.2 at. % carbon.

5. The method according to claim 4, comprising forming the eSiGe:C with about 0.08 at. % to about 0.15% carbon.

6. The method according to claim 5, comprising forming the eSiGe:C with about 0.1 at. % carbon.

7. The method according to claim 6, comprising amorphizing to relax compressive strain by implanting a dopant.

8. The method according to claim 7, comprising amorphizing by implanting germanium (Ge), Xenon (Xe), or silicon (Si).

9. A method of fabricating a CMOS semiconductor device comprising:
    forming in-situ boron-doped embedded silicon germanium (eSiGe) in first source/drain regions on a substrate, to form a PMOS transistor;
    epitaxially growing in-situ phosphorus doped embedded silicon germanium containing carbon (eSiGe:C) in second source/drain regions on a substrate to form an NMOS transistor; and
    implanting an amorphization dopant only in the in-situ phosphorus doped eSiGe:C to neutralize compressive strain.

10. The method according to claim 9, comprising growing the eSiGe:C with a carbon content less than about 0.2 at. % carbon.

11. The method according to claim 10, comprising growing the eSiGe:C with a carbon content of about 0.08 at. % to about 0.15% carbon.

12. The method according to claim 11, comprising implanting Ge, Xe, or Si as the amorphizing dopant.

* * * * *